United States Patent
Marie (10) Patent No.: US 7,565,128 B2
(45) Date of Patent: Jul. 21, 2009

(54) HIGH PERFORMANCE LOW NOISE AMPLIFIER

(75) Inventor: Hervé Jean François Marie, Ver sur Mer (FR)

(73) Assignee: NXP B.V., Eindhoven (NL)

( * ) Notice: Subject to any disclaimer, the term of this patent is extended or adjusted under 35 U.S.C. 154(b) by 507 days.

(21) Appl. No.: 10/572,885

(22) PCT Filed: Sep. 15, 2004

(86) PCT No.: PCT/IB2004/003061

§ 371 (c)(1),
(2), (4) Date: Mar. 20, 2006

(87) PCT Pub. No.: WO2005/029696

PCT Pub. Date: Mar. 31, 2005

(65) Prior Publication Data

US 2008/0125072 A1    May 29, 2008

(30) Foreign Application Priority Data

Sep. 23, 2003 (EP) .................................. 03300129

(51) Int. Cl.
  H04B 1/26      (2006.01)
  H04Q 7/20      (2006.01)
(52) U.S. Cl. .................. 455/326; 455/333; 455/341; 327/359; 330/252
(58) Field of Classification Search .................. 455/313, 455/323, 326, 333; 327/357, 359; 330/252
See application file for complete search history.

(56) References Cited

U.S. PATENT DOCUMENTS

| | | | |
|---|---|---|---|
| 6,157,822 A * | 12/2000 | Bastani et al. | ............... 455/323 |
| 6,496,545 B1 | 12/2002 | Liu | |
| 7,016,664 B2 * | 3/2006 | Souetinov | .................... 455/323 |
| 2002/0098820 A1 | 7/2002 | Dijkmans | |
| 2003/0169089 A1 | 9/2003 | Manku et al. | |

FOREIGN PATENT DOCUMENTS

EP    0 434 203    6/1991

* cited by examiner

*Primary Examiner*—Lee Nguyen (57) ABSTRACT

A signal processing circuit is proposed, which is intended to receive a pair of input signals Sp and Sn in phase opposition on two input terminals and to provide two pairs of output currents SIp and SIn in phase opposition on four output terminals. Each input signal Sp and Sn is amplified in an amplification unit LNAUp and LNAUn and subsequently split in a splitting unit SPLUp and SPLUn. The invention is such that each of the two splitting units SPLUp and SPLUn includes at least two branches, respectively BIp, BQp and BIn, BQn connected between said amplification unit, respectively LNAUp and LNAUn, and one of said output terminals, the four branches BIp, BQp and BIn and BQn each including at least an impedance, respectively RIp, RQp, RIn, RQn, having identical characteristics. Mixer circuits can be easily stacked with this signal processing circuit.

12 Claims, 7 Drawing Sheets

HIGH PERFORMANCE LOW NOISE AMPLIFIER

The invention concerns the field of radio receiver circuits. More particularly the invention relates to circuit topology of a signal processing circuit intended to be stacked with two quadrature mixer circuits. Such a signal processing circuit receives a pair of input signals in phase opposition on two input terminals and provides two pairs of output currents in phase opposition on four output terminals, each input signal being amplified in an amplification unit and being split in a splitting unit. Said output terminals of said signal processing circuit are then connected to said mixer circuits in such a way that each mixer circuit receives a pair of signals that are in phase opposition. Such a pair of signals that are in phase opposition can also be called differential signal, said differential signal meaning said pair of signals.

In its different applications, the invention notably relates to the reception of signals like, for example, radio signals, telecommunication signals, telephone signals, audio baseband signals, wireless analog signals, video signals etc . . . .

The invention also concerns any receiver for such signals and chips intended to be implemented in said receiver. Such a receiver can be a phone in wireless standard, DECT for example, a radio receptor, a wireless controller . . . .

Figure 1:
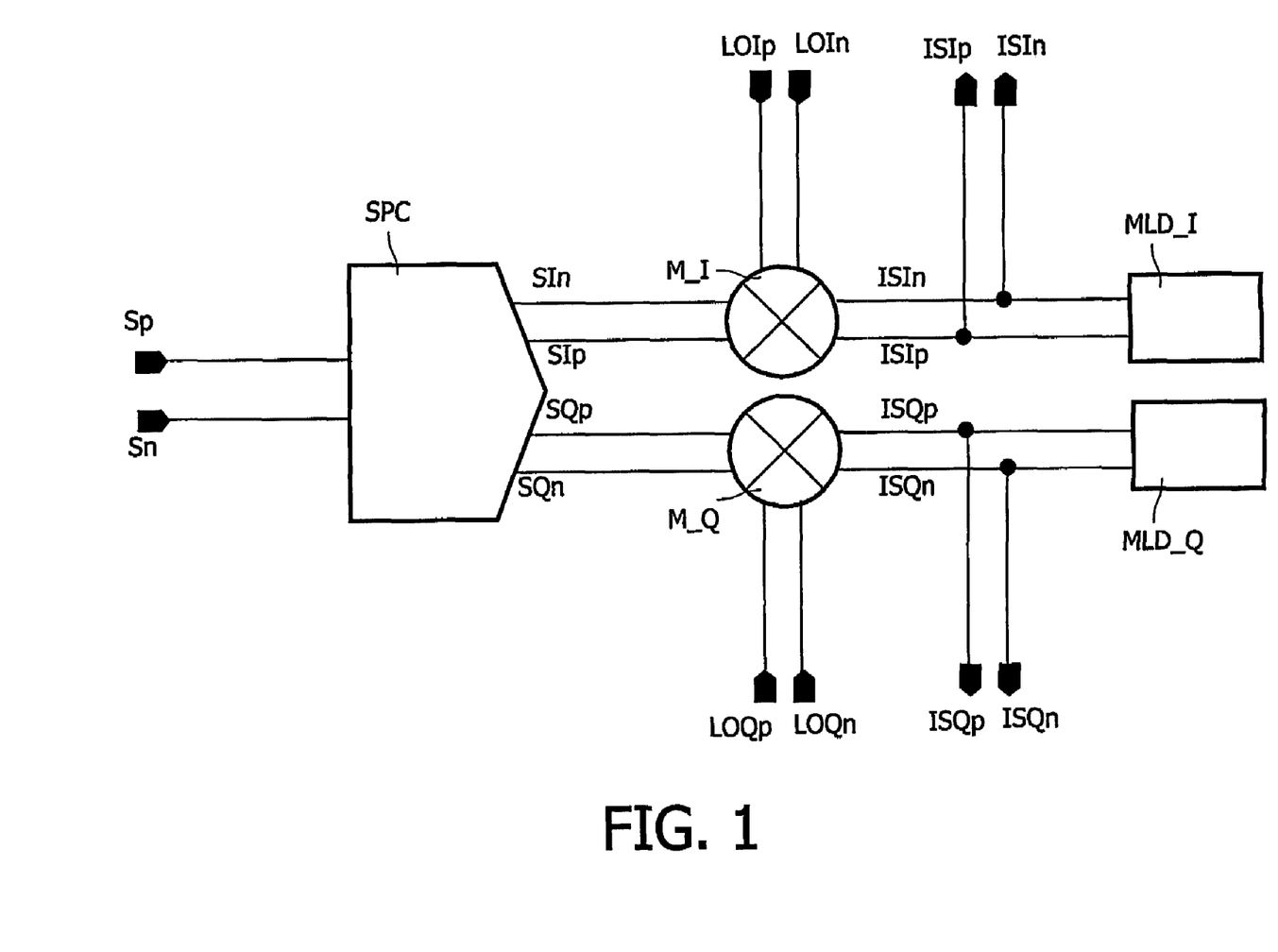
FIG. 1 represents a schematic diagram of a reception chain as known in the prior art.

First tasks performed in a reception chain RC as represented in FIG. 1 in a radio receiver circuit are amplification of signals in order not to corrupt said signals with too a high noise floor and a frequency translation that allows further processing at a much lower signal frequency. As stated above, signals are, for example, radio frequency signals and are constituted of a pair of input signals that are in phase opposition Sp and Sn.

In such a reception chain, the use of two mixer circuits M_I and M_Q operated by two local oscillation signals in quadrature, LOI and LOQ, allows an image rejection and consequently enhances the quality of the reception. Often, as with the double-balanced Mixer from Gilbert, mixer circuits need currents at their inputs. It has to be noted that the term 'mixer circuit' designates here the part of the circuit that does the frequency translation, the signal processing circuit designating the part of the circuit that prepares the input signal for entering into the mixer circuit. Thus, a Gilbert quad is a good example of a mixer circuit.

In such a case, a signal processing circuit SPC as described in the introduction is necessary to provide two pairs of current signals (SIn,SIp) and (SQn,SQp) from a pair of signals in phase opposition (Sp and Sn), one for the mixer M_I and one for the mixer M_Q.

Each mixer then provides a pair of signals in phase opposition (ISIn,ISIp) and (ISQn,ISQp) at an intermediate frequency. The two pairs of signals provided by the two mixers are in phase quadrature: ISIn in quadrature with ISQn and ISIp with ISQP. It can also be said that the differential signal ISQ=ISQp−ISQn is in quadrature with ISI=ISIp−ISIn. The two mixer circuits are charged by respective loads MLD_I and MLD_Q.

A popular signal processing circuit of the prior art has a two-stage topology. The first stage is a low noise voltage amplification unit, for example using a transistor, called amplification transistor. The amplified voltage is then applied to a splitting unit including two I and Q differential transconductances in a second stage. The first stage performs a voltage amplification while the second performs a voltage to current conversion.

The voltage gain of the first stage has to be low in order to fulfill the linearity constraint. Moreover, with such a two-stage topology large voltage swings are observed on the first stage output at the frequency of the input signals and its harmonics. This might disturb local oscillation signals.

Figure 2:
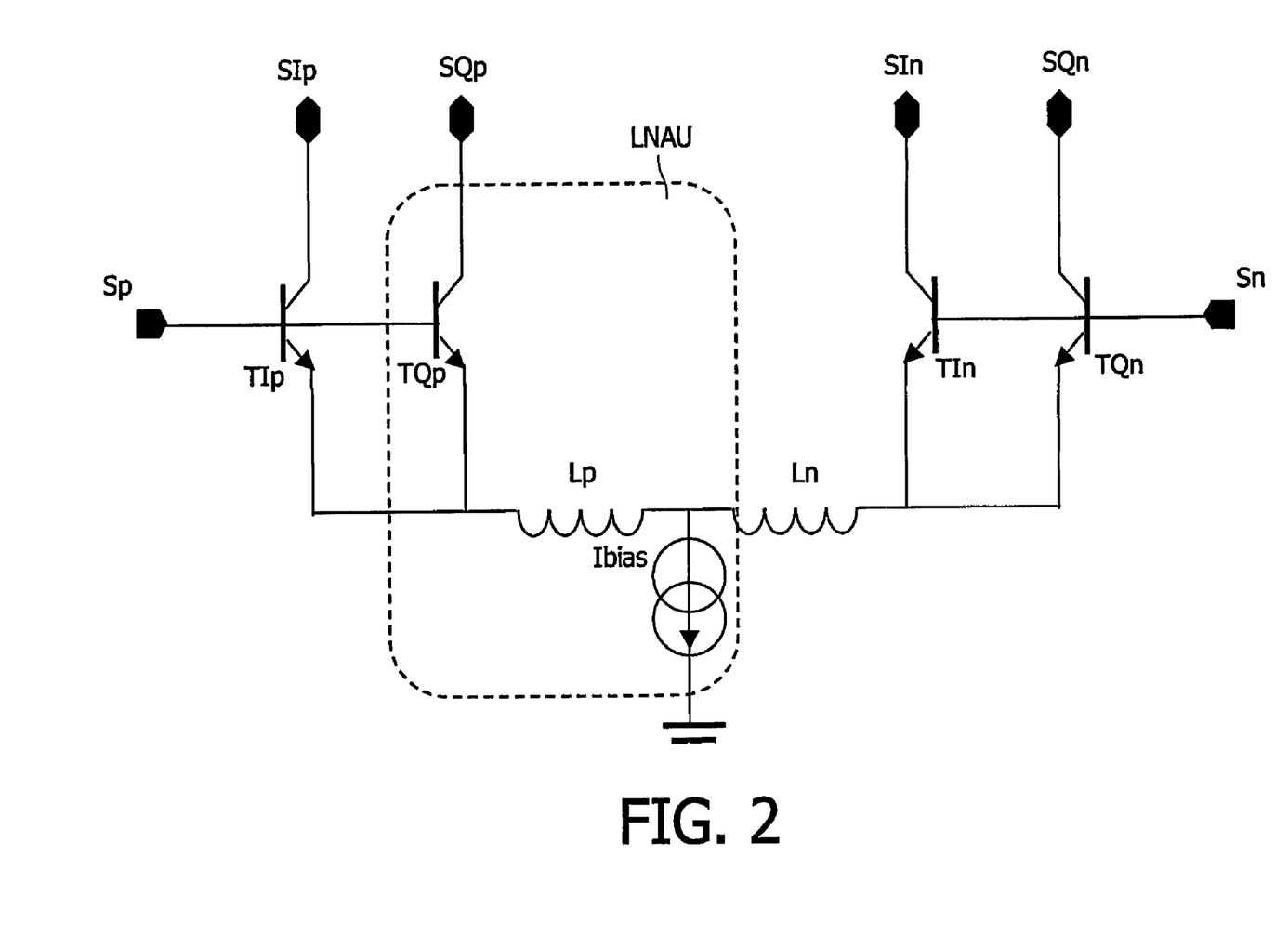
FIG. 2 represents a signal processing circuit as known in the prior art.

A single stage topology for a signal processing circuit as presented in the introduction is proposed in European patent application EP0998025. As represented in FIG. 2, I and Q transconductances are two duplicated amplification units LNAU as used in the two-stage topology described hereinbefore. Indeed, using four amplification transistors instead of two enables to use each amplification transistor as a transconductance. The two mixer circuits are directly connected to the collector of amplification transistors TIp, TQp, TIn, TQn in such a way that each mixer circuit receives a pair of signals in phase opposition. In this one-stage topology it is observed that local oscillation signals leak to radio signal inputs. This is a problem especially in architecture where frequencies of local oscillation signals and input signals are identical.

An object of one or more embodiments is thus to propose a circuit topology for a signal processing circuit offering improved performance in terms of linearity and noise performance. Moreover, the invention allows to reduce disturbances in the generation of local oscillation signals that are provided to mixer circuits.

To this end, the invention proposes that each of the two splitting units includes two branches connected between the respective amplification unit and one of the four output terminals, the four branches each including at least an impedance having identical characteristics.

This exemplary embodiment of the invention allows an improved noise performance since the input signal is not amplified to a large voltage at the frequency of the input signal. This topology allows a better noise performance than the one-stage topology of the prior art. This presents a better isolation of the input signals from the local oscillation signals than with the one-stage topology of the prior art. Moreover, this may provide good isolation of the generator of local oscillation signals from the disturbances that could be generated by input signals.

Alternatively, the impedance has a resistance value such that said value determines the splitting of the input signal independently of the stacked mixer circuits. Indeed, the splitting of current is determined by the matching of the splitting impedance rather than the matching of the transistors of the mixer circuits. It allows to keep these transistors small and thus fast, for an improved switching speed. This will result in a better noise performance.

An implementation of the amplification unit may use at least one amplification transistor, of which the base is connected to one input terminal and the collector is connected to said splitting unit.

The invention also proposes embodiments that present superior isolation of the input signals from disturbances generated by local oscillation signals.

Thus, in another exemplary embodiment, each of the four branches further includes a cascode transistor, bases of said four cascode transistors being connected together.

In another embodiment, each of the two amplification units includes at least an amplification transistors, of which the base is connected to one input terminal and the collector is connected to another transistor in cascode, said transistor in cascode being connected by its collector to the respective splitting unit and being connected by its base to the transistor in cascode of the other amplification unit.

The invention also relates to a chip implementing a signal processing circuit according to the invention and a receiver including such a chip.

Additional objects, features and advantages of the invention will become apparent upon reading the following detailed description and upon reference to the accompanying drawings in which.

In the following description, functions or constructions well-known to the person skilled in the art are not described in detail in order not to obscure the invention.

FIG. 1 presents a schematic diagram of a reception chain RC as known in the prior art. This Figure has already been described hereinabove. The invention concerns the topology of the signal processing circuit SPC. Consequently this schematic diagram also represents a reception chain RC as implemented in a chip according to the invention as soon as said signal processing circuit SPC is according to the invention.

FIG. 2 presents a signal processing circuit as known in the prior art. Using this signal processing circuit, the same bias current is shared between said signal processing circuit and mixer circuits. Effectively signals provided on outputs of four amplification transistors, of which bases are connected to the input signals, are currents. Said amplification transistors also constitute a splitting unit. This allows to directly connect a mixer circuit that requires a current input. The signal processing circuit SPC and mixer circuits are consequently stacked on top of each other. The advantage of a shared bias current with mixer circuits is also provided by the invention.

Figure 3:
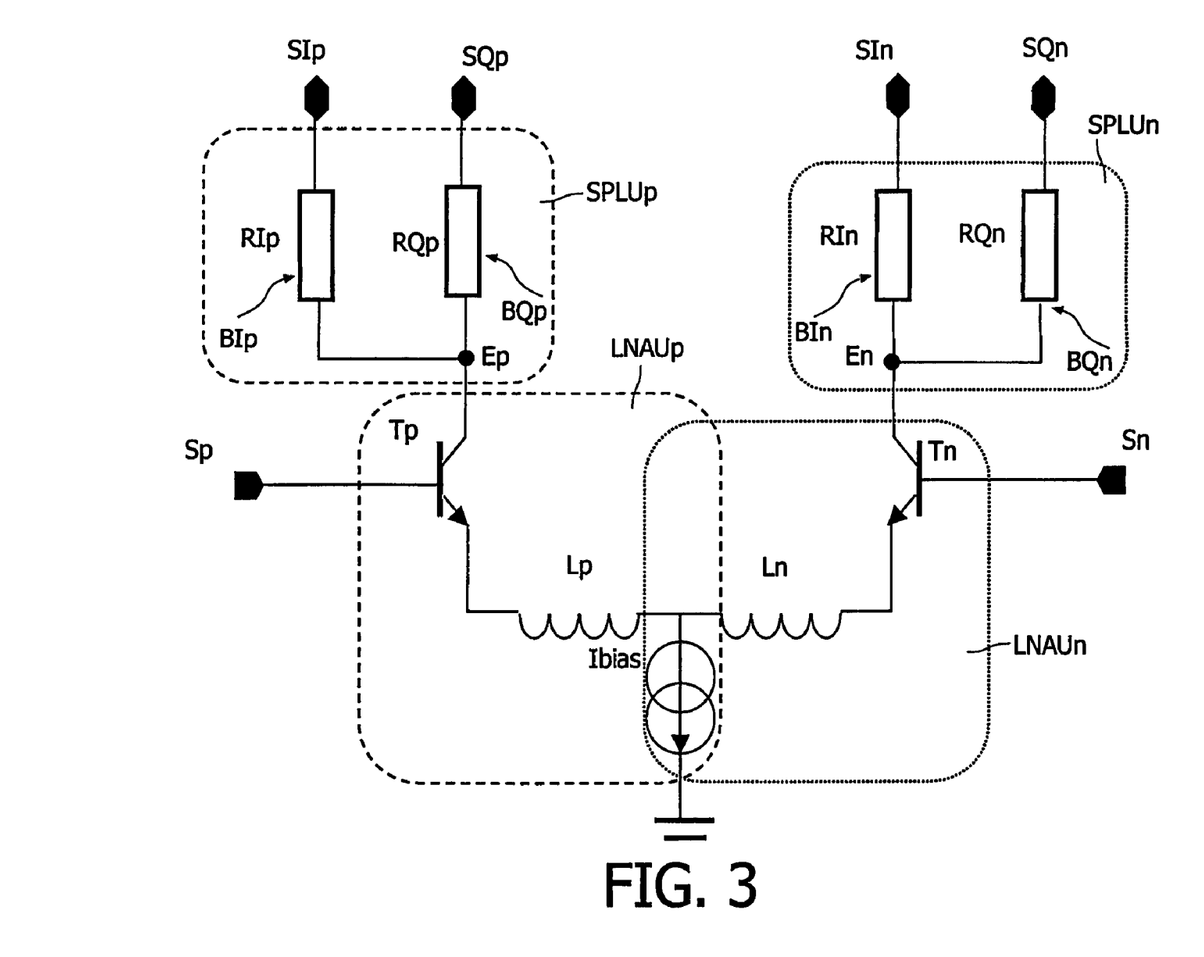
FIG. 3 represents a first embodiment of a signal processing circuit according to the invention.

FIG. 3 presents a first embodiment of a signal processing circuit SPC according to the invention. Said signal processing circuit is intended to receive a pair of input signals in phase opposition (Sn and Sp) on two input terminals and to provide two pairs of output currents in phase opposition (SIn,SIp) and (SQn,SQp) on four output terminals intended to be connected to said two mixer circuits. Each input signal Sn and Sp is amplified by a low noise amplification unit LNAUn and LNAUp and is split by a splitting unit SPLUn and SPLUp.

For example, said low noise amplification unit LNAU is conventionally realized through an amplification transistor Tp and Tn. Signal Sn is provided to the base of an amplification transistor Tn and signal Sp is provided to the base of an amplification transistor Tp. Said amplification transistors Tp and Tn are biased by a common biasing intensity Ibias, connected through an inductive element Lp and Ln to the emitter of said amplification transistors Tp and Tn. The collector of each amplification transistor Tp and Tn is connected to the respective splitting unit SPLUp and SPLUn.

A splitting unit SPLU includes two branches called BI and BQ. In this paragraph, only the splitting unit SPLUp for the signal Sp is described. The description would be similar for the signal Sn by replacing p by n in the references. The two branches BIp and BQp are connected at a node Ep connected to said amplification unit LNAUp and one of said output terminals. Each branch BIp and BQp respectively includes at least an identical low value resistance RIp and RQp. The role of such resistors RIp and RQp is that the accuracy of the current splitting is realized through said resistors instead of through the transistors of the mixer circuits. Typically the DC voltage to be applied to the splitting unit is $2.VT=50$ mV in order to get rid of the influence of the resistance of the mixer circuits and their loads, constituted by Gilbert quads for example. The matching is thus made by the resistors of the splitting unit independently of the resistance of the mixer circuits and their load. The DC voltage at the terminals of a load resistor is generally around 800 mV. The resistor of the splitting unit is thus advantageously $800/50=16$ times smaller than a load resistor. The current arriving on node Ep is thus split between the two branches thanks to the presence of the two resistances of the splitting unit. As these resistances are of a low value, they do not introduce any gain. Moreover large voltage headroom is available as only one transistor is used and resistances are of low value.

Figure 4:
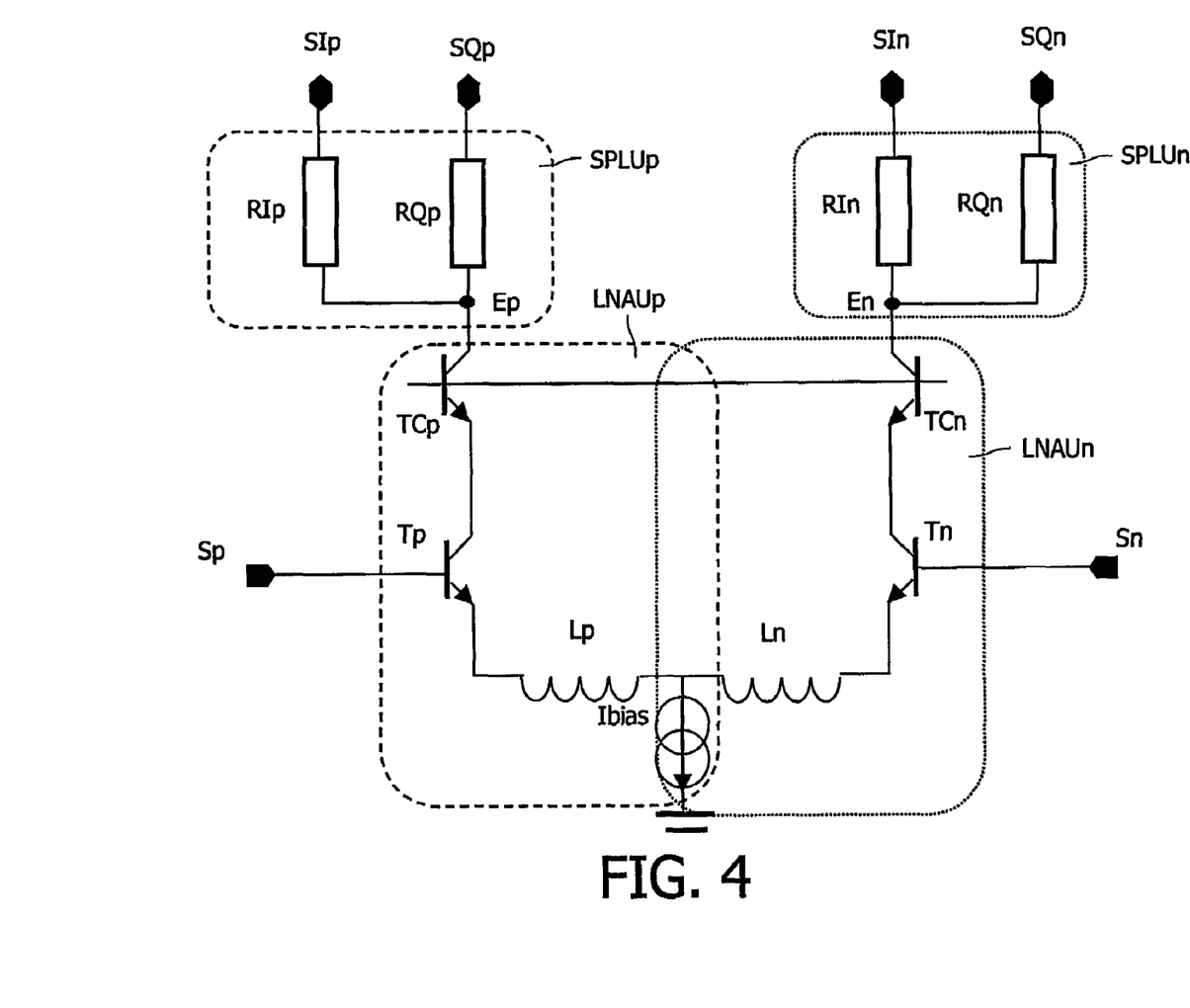
FIG. 4 represents a second embodiment of a signal processing circuit according to the invention.

FIG. 4 presents another exemplary embodiment of a signal processing circuit according to the invention. The embodiment of FIG. 4 proposes to add another transistor in cascode TCp and TCn to each amplification unit LNAUp and LNAUn. Such a transistor in cascode TCp and TCn has an isolation function against leaks from local oscillation signals LO to the input signal S. For the p side, said transistor in cascode TCp is connected, by its emitter, to the amplification transistor Tp and, by its collector, to said splitting unit SPLUp and, by its base, to the transistor in cascode TCn of the other amplification unit LNAUn. The voltage headroom is reduced but the disturbance caused by local oscillation to the input signal is reduced.

Figure 5:
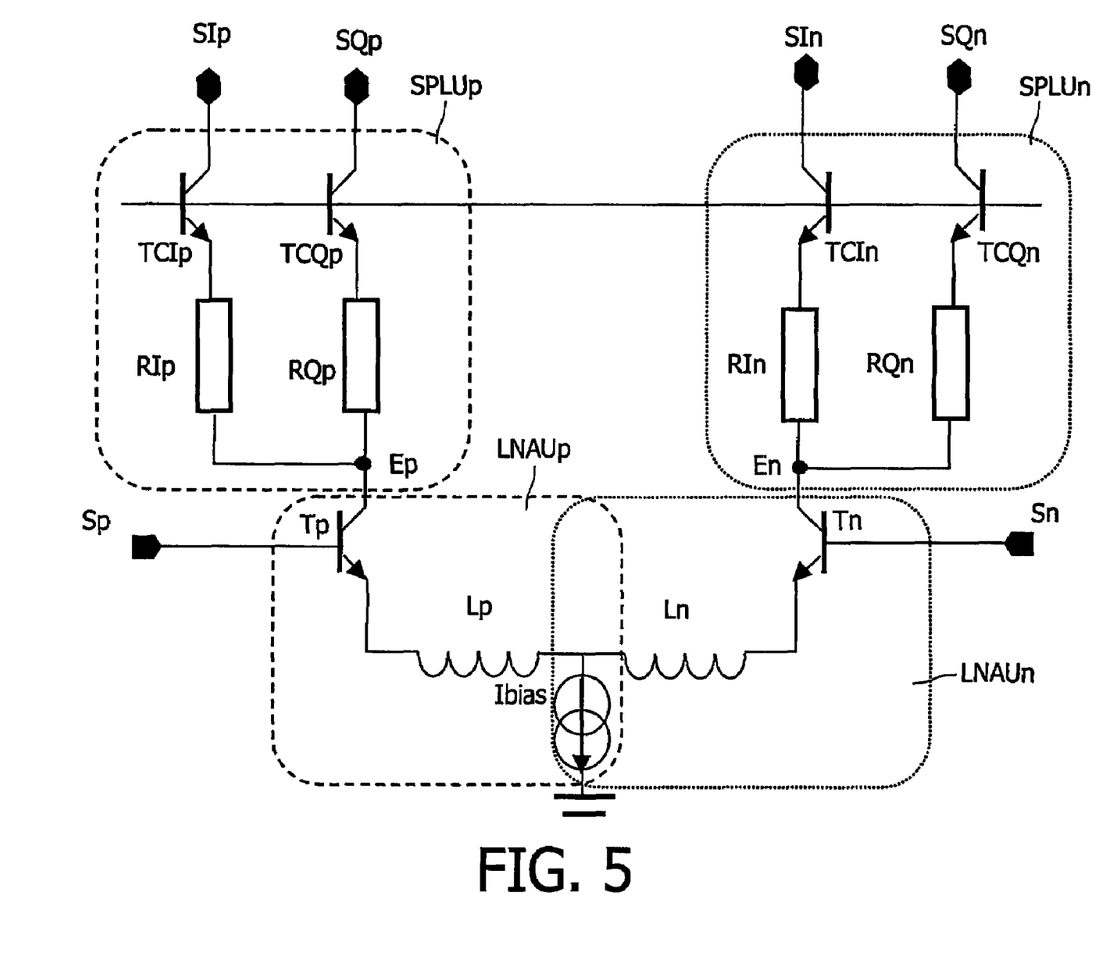
FIG. 5 represents a third embodiment of a signal processing circuit according to the invention.

FIG. 5 presents yet another embodiment of a signal processing circuit. In this embodiment, the above-mentioned isolation is realized through cascode transistors inserted on each branch of the two splitting units SPLUp and SPLUn. The bases of the four cascode transistors are connected together. This solution may be useful for architectures where the disturbances from local oscillation signals to input signals are important.

The main parameters to be adjusted for a reception chain as generically presented in FIG. 1 are the noise, the linearity, the local oscillation disturbances, the dissipated power and the die area. These parameters are more or less critical depending on the application to which the reception chain is dedicated.

The noise is mainly created by transistors of the circuit. The main noise contributors are shot noise and thermal noise from input transistors, base and collector. This noise is identical for any implementations of the transistor. Equivalent input voltage and current are identical noise contributors.

Linearity properties are similar and better for all presented one-stage topologies than for the two-stage topology.

The local oscillation disturbances are critical. Especially the application where the local oscillation signals might be disturbed by the input radio signals (ZIF applications . . . ). This is related to the so-called local oscillation pulling phenomenon: oscillators are very sensitive to disturbances that arise close to their oscillation frequency. Thus in the ZIF architecture, the oscillator frequency is equal to the RF frequency, or one of its harmonics.

The dissipated power is usually a significant portion of overall circuit consumption.

The die area is generally not very critical for this kind of circuit.

Figure 6:
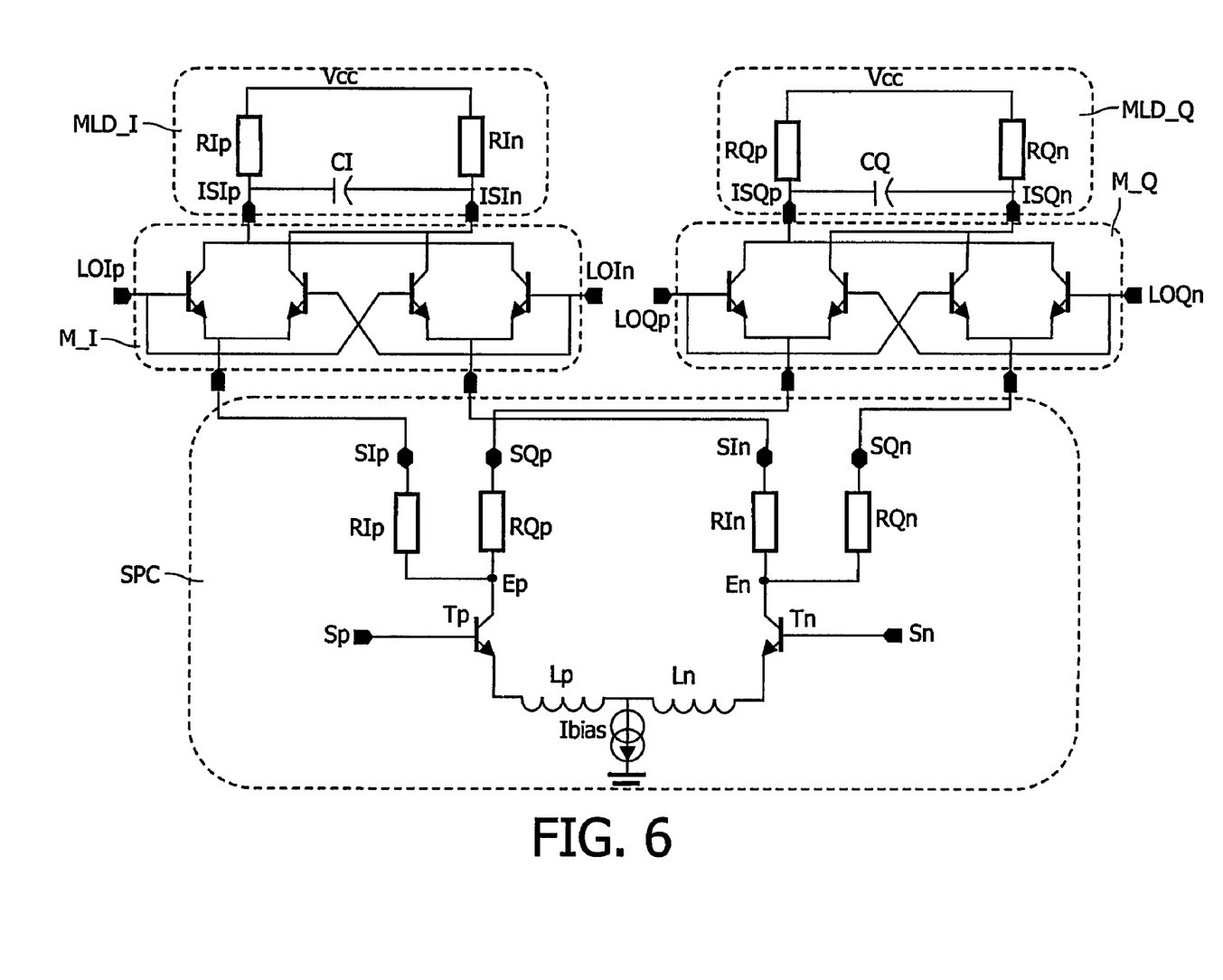
FIG. 6 represents a signal processing circuit according to the invention stacked with two mixers.

As represented in FIG. 6, a very popular circuit for the mixer circuit is the double-balanced Mixer from Gilbert, called Gilbert quad. A Gilbert quad translates signals S at input frequency INF to signals IS at intermediate frequency IF. The intermediate frequency IF depends upon the local oscillation signal frequency LOF as IF=INF−LOF.

It is important to note that the output from the Gilbert quad is a current, rather than a voltage. For this reason, a current to voltage load MLD_I, MLD_Q, e.g. a simple resistor RIp, RIn, RQp, RQn, needs to be connected at the mixer outputs on which output signals ISIp, ISIn, ISQP and ISQn are provided. Capacitors CI and CQ are implemented to filter out out-of-channel interferences that may exist when running at intermediate frequency IF.

Moreover the signal processed by a Gilbert quad is also a current. This is the reason why the signal fed from the signal processing circuit SPC to the mixer circuit is a current.

Figures 7, 8:
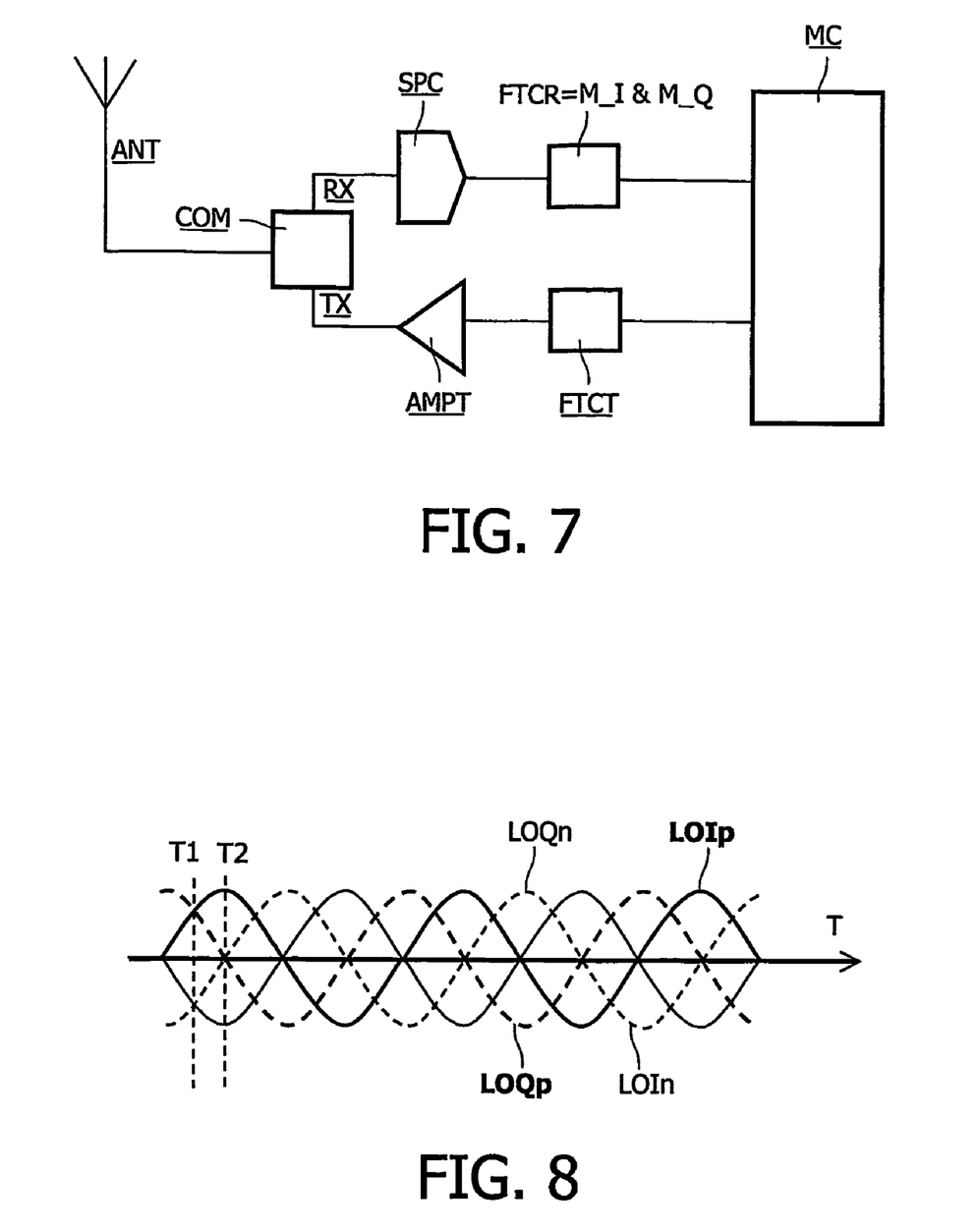
FIG. 7 represents a block diagram of a receiver of radio frequency signals according to invention.
FIG. 8 represents the local oscillation signals in the temporal dimension.

Consequently a signal processing circuit providing a current at its outputs can directly be stacked with mixer circuits. Thus, FIG. 6 presents a signal processing circuit according to the invention stacked with two mixers. Such stacked circuits are thus reproduced on a chip according to the invention. Said chip generally includes other functions for the functioning of a receiver of the invention as represented in FIG. 7.

The properties of the different signal processing circuit embodiments of the invention and of the prior art will now be described and compared.

The signal processing circuit represented in FIG. 2 has noise and linearity properties superior to the ones of a two-stage topology, especially at large emitter degeneration. Nevertheless it presents drawbacks as above stated.

The signal processing circuit represented in FIG. 3 presents very good overall performance. It offers a large voltage headroom. The current split is determined by the mixers that are connected on outputs of said signal processing circuit and by the resistors RIp, RIn and RQp, RQn. The splitting of the current is based on the differential local oscillation signals having identical swings and a common mode. In the temporal dimension as represented in FIG. 8, the two cases presented below are possible.

If LOIp=LOQp and they are superior to LOIn=LOQn (point at time T1 in FIG. 8), the current delivered by Tp is equally divided between RIp and RQp, as expected. This is similar for Tn and the n side. All other combinations with local oscillation signals in opposite states give a similar half-half split.

If LOIp is greater than LOQp=LOQn, that is LOIp is greater than LOIn (point at time T2), this means that LOI is in one state and LOQ is changing from one state to the other. This is the case if the four signals LOIp, LOIn, LOQp, LOQn all have the same continuous part DC, but different phases. The emitters of a transistor follow the one that has the higher potential. Thus, the current delivered by Tp is flowing totally into RIp and then to the mixer circuit M_I. Consequently the burst of noise coming from the mixer M_Q, when at equilibrium, is very low since the mixer M_Q is off. This advantage is not present in the state of the art as transistors in mixer circuits never behave as diodes during operation because of a transistor's emitter effect. In other topologies of the state of the art, the I side has no influence on the Q side. This is different in the invention because of the structure of the splitting unit. Because of the presence of a resistance in the splitting unit, the sum of the p and n signals presents variations because of the transistor's emitter effect. Another advantage is that no current is lost in the mixer when there is temporairly no gain (M_Q here). It makes overall mixer gain higher. This is similar for Tn and the n side.

The I-Q gain matching, in order to have the same gain on each I and Q side, is determined by the matching of the resistors RI and RQ and, to a smaller extent, of the transistors of the I and Q mixer circuits.

In FIG. 4, cascode transistors TCp, TCn are inserted in the amplification units. Their role is to absorb the disturbances generated from local oscillation signals to input signals. Consequently, the signal processing circuit as presented in FIG. 4 presents a better isolation of input signals.

In FIG. 5, cascode transistors TCIp, TCQp, TCIn, TCQn are inserted in the splitting unit above the resistors. Their role is also to absorb the disturbances generated from local oscillation signals to input signals. In this embodiment, if resistors RIn, RIp, RQp, RQn are omitted (that is set to zero value) then the gain matching depends on the cascode transistors matching, which calls for big cascode transistors. On the other hand, a non zero resistor value, as in FIG. 3, can introduce the Miller effect. A compromise can be realized by the man skilled in the art between the cascode transistor size and the value of the resistor.

Gain for the signal processing circuits presented in FIG. 2 to FIG. 5 is:

$$G = gm \cdot \frac{1}{2} \cdot \frac{2}{\pi} \cdot R = \frac{2}{\pi} \cdot \frac{V_R}{VT} = \frac{2}{\pi} \cdot \frac{0.8}{0.025} = -4 + 30 = 26\,\text{dB}$$

This calculation is done assuming that the amplification transistor emitter degeneration does not change the gain very significantly (in practice it might be some −3 dB), that the size of amplification transistors of the signal processing circuit of FIG. 2 is half that of amplification transistors of the embodiments of the invention. Current density is therefore identical for all presented circuit topologies. Consequently, overall base resistors of amplification transistors are equal for all topologies. Moreover the mixer gain is assumed ideal and equals −4 dB (2/pi).

Conventions are:

gm is the amplification unit input transconductance,

R is the mixer load.

This gain is slightly inferior to the one obtained with the two-stage topology that is around 30 dB.

At low emitter degeneration, the main noise contributors of all topologies, including the one of the prior art, are identical. One-stage topologies have fewer components to contribute to noise. But this is balanced by the mixer circuits that are slightly noisier because there was a bit less gain in front of them. On embodiments presented in FIGS. 3 and 4 a noise term depending on commutation speed of the quad is fairly reduced. Consequently, Voltage headroom is more comfortable with only two stacked transistors, for the embodiment presented in FIG. 3.

The isolation of the input signal from the local isolation leaks is very good for the embodiments presented in FIGS. 4 and 5.

The isolation of the local oscillation signals from the input signals' leaks is weak in two-stage topologies where the input voltage is amplified. The embodiment presented in FIG. 5 amplifies the input signal on top of the amplification transistors and as the current split is done with resistors, leaks can occur. The other embodiments of the invention present a good isolation.

Benefits of the one or more embodiments of the invention are superior noise performance at lower bias current. Embodiments that present a reduced impact on pulling the input signal to the local oscillation signals are also proposed.

An application of the invention concerns reception chains as small signals have to be processed. Nevertheless, a circuit as described in FIG. 6 can also be used in a transmission chain for example to have good linearity characteristics. If larger signals are processed, the use of the invention is less critical but can be advantageous.

FIG. 7 presents a block diagram of a receiver of radio frequency signals according to the invention. Generally such a receiver is intended to receive and to transmit signals through an antenna ANT. A commutation device COM controls the access to the antenna ANT. Said commutation device COM is connected at least to a reception chain RX and to a transmission chain TX. Said reception chain RX includes at least a signal processing circuit SPC according to the invention and a frequency translation unit FTCR, generally constituted of mixer circuits. A processing unit MC follows these circuits. This processing unit MC also processes the signals to be transmitted and is thus connected to a transmission chain TX that includes at least a frequency translation unit FTCT and an amplification unit AMPT. Such a receiver is advantageously a telecommunication apparatus: mobile phone . . . .

The embodiment as disclosed in FIG. 3 and the embodiments presented in FIGS. 4 and 5 are not exclusive. Other alternative embodiments may be derived in accordance with principles of the invention defined in the Claims to accomplish the same objectives.

It is to be understood that the present invention is not limited to the aforementioned embodiments and variations and modifications may be made without departing from the spirit and scope of the invention as defined in the appended claims. In this respect, the following closing remarks are made.

It is to be understood that the present invention is not limited to the used type of transistors. Similar embodiments can use other transistor types, e.g. MOS . . . . Resistive emitter degeneration can be used rather than inductive emitter degeneration. However, inductive degeneration allows superior noise performance. Also, a current source, often implemented as a pure resistance connected from the power supply to the emitters of the cascode transistors, or to the emitters of the Gilbert, quads can be added. It allows to get both a high input transconductance from the input pair, and a low voltage drop across the resistor load.

It is to be understood that the invention is not limited to the aforementioned telecommunication application. The invention can be used within any application using a reception chain needing a frequency translation before further processing. Radio frequency applications are thus of particular interest to the invention.

Any reference sign in the following claims should not be construed as limiting the claim. It will be obvious that the use of the verb "to comprise" and its conjugations do not exclude the presence of any other steps or elements besides those defined in any claim. The article "a" or "an" preceding an element or step does not exclude the presence of a plurality of such elements or steps.

I claim:

1. A signal processing circuit intended to be stacked with two mixer circuits, said signal processing circuit being intended to receive a pair of input signals in phase opposition on two input terminals and to provide two pairs of output currents in phase opposition on four output terminals intended to be connected to said two mixer circuits in order that each mixer circuit receives one pair of output currents in phase opposition, each input signal being amplified by a respective low noise amplification unit and being split by a respective splitting unit, characterized in that each of the two splitting units includes two branches connected between the respective amplification unit and one of the four output terminals, the four branches each including at least an impedance having identical characteristics.

2. A signal processing circuit as claimed in claim 1, wherein each of the four branches of the two splitting units are farther configured to exhibit an impedance, wherein the impedance has a resistance value such that said value determines the splitting of the input signal independently of the stacked mixer circuits.

3. A signal processing circuit as claimed in claim 1, wherein each of the four branches further includes a cascode transistor, bases of said four cascode transistors being connected together.

4. A signal processing circuit as claimed in claim 1, wherein each of the two amplification units includes at least one amplification transistor, of which the base is connected to one input terminal and the collector is connected to a respective splitting unit.

5. A signal processing circuit as claimed in claim 1, wherein each of the two amplification units includes at least an amplification transistor, of which the base is connected to one input terminal and the collector is connected to another transistor in cascode, said transistor in cascode being connected by its collector to a respective splitting unit and being connected by its base to the transistor in cascode of the other amplification unit.

6. A chip intended to be implemented in a receiver, said chip including at least a signal processing circuit and two mixer circuits receiving local oscillation signals in phase quadrature, said output terminals of said signal processing circuit being connected to said mixer circuits in such a way that each mixer circuit receives a pair of signals that are in phase opposition, characterized in that said signal processing circuit is as claimed in claim 1.

7. A receiver of radio-frequency signals including at least an antenna, a reception chain, a processing unit, characterized in that it includes a chip as claimed in claim 6.

8. A signal processing circuit intended to be stacked with two mixer circuits, said signal processing circuit being intended to receive a pair of input signals in phase opposition on two input terminals and to provide two pairs of output currents in phase opposition on four output terminals intended to be connected to said two mixer circuits in order that each mixer circuit receives one pair of output currents in phase opposition, each input signal being amplified by a respective low noise amplification unit and being split by a respective splitting unit, characterized in that each of the two splitting units includes two branches connected between the respective amplification unit and one of the four output terminals, the four branches each including at least an impedance having identical characteristics, wherein each of the two amplification units includes at least an amplification transistor, of which the base is connected to one input terminal and the collector is connected to another transistor in cascode, said transistor in cascode being connected by its collector to a respective splitting unit and being connected by its base to the transistor in cascode of the other amplification unit.

9. A signal processing circuit as claimed in claim 8, wherein each of the four branches of the two splitting units are further configured to exhibit an impedance, wherein the impedance has a resistance value such that said value determines the splitting of the input signal independently of the stacked mixer circuits.

10. A signal processing circuit as claimed in claim 8, wherein each of the four branches further includes a cascode transistor, bases of said four cascode transistors being connected together.

11. A chip intended to be implemented in a receiver, said chip including at least a signal processing circuit and two mixer circuits receiving local oscillation signals in phase quadrature, said output terminals of said signal processing circuit being connected to said mixer circuits in such a way that each mixer circuit receives a pair of signals that are in phase opposition, characterized in that said signal processing circuit is as claimed in claim 8.

12. A receiver of radio-frequency signals including at least an antenna, a reception chain, a processing unit, characterized in that it includes a chip as claimed in claim 11.

* * * * *